United States Patent
Zheng et al.

(10) Patent No.: US 7,876,127 B2
(45) Date of Patent: Jan. 25, 2011

(54) AUTOMATIC HOLD TIME FIXING CIRCUIT UNIT

(75) Inventors: Liang-An Zheng, Tainan County (TW); Pu-Jen Cheng, Tainan (TW); Shinn-Horng Chen, Kaohsiung (TW)

(73) Assignee: National Kaohsiung University of Applied Sciences, Kaohsiung (TW)

( * ) Notice: Subject to any disclaimer, the term of this patent is extended or adjusted under 35 U.S.C. 154(b) by 0 days.

(21) Appl. No.: 12/537,720

(22) Filed: Aug. 7, 2009

(65) Prior Publication Data
US 2010/0295592 A1  Nov. 25, 2010

(30) Foreign Application Priority Data
May 20, 2009  (TW) .............................. 98116723 A (51) Int. Cl.
*H03K 19/173* (2006.01)
*H03K 19/00* (2006.01)

(52) U.S. Cl. ............................. 326/46; 326/93; 327/198

(58) Field of Classification Search .................. 326/40, 326/46, 93–94; 327/185, 198, 212, 213
See application file for complete search history.

(56) References Cited

U.S. PATENT DOCUMENTS

| | | | | |
|---|---|---|---|---|
| 5,081,377 A | * | 1/1992 | Freyman | ...................... 327/198 |
| 5,654,658 A | * | 8/1997 | Kubota et al. | ................ 327/202 |
| 5,912,428 A | | 6/1999 | Patti | |
| 6,407,601 B1 | | 6/2002 | Lin | |
| 6,538,471 B1 | * | 3/2003 | Stan et al. | ....................... 326/46 |
| 6,646,464 B2 | * | 11/2003 | Maruyama | .................... 326/35 |
| 2006/0038596 A1 | | 2/2006 | Wang | |

* cited by examiner

*Primary Examiner*—James Cho
(74) *Attorney, Agent, or Firm*—Muncy, Geissler, Olds & Lowe, PLLC (57) ABSTRACT

An automatic hold time fixing circuit unit includes a first switch having first and second ends connected to data input and output ports. An input end of a memory element is connected to the second end of the first switch. A second switch includes a first end connected to an output end of the memory element and a second end connected to the data output port. A control circuit includes first and second output terminals and first and second input terminals. The first and second output terminals are connected to control ends of the first and second switches. The first and second input terminals allow input of two clocks to the control circuit for controlling connection or disconnection of the first and second switches. The data stored in the memory element can be utilized to fix a hold time of the data, so that correct data can be obtained at the data output port.

14 Claims, 10 Drawing Sheets

AUTOMATIC HOLD TIME FIXING CIRCUIT UNIT

BACKGROUND OF THE INVENTION

1. Field of the Invention

The present invention relates to an automatic hold time fixing circuit unit and, more particularly, to an automatic hold time fixing circuit unit capable of automatically increasing the sufficient delay time to avoid erroneous data output resulting from an unbalanced clock tree.

2. Description of the Related Art

Figure 1:
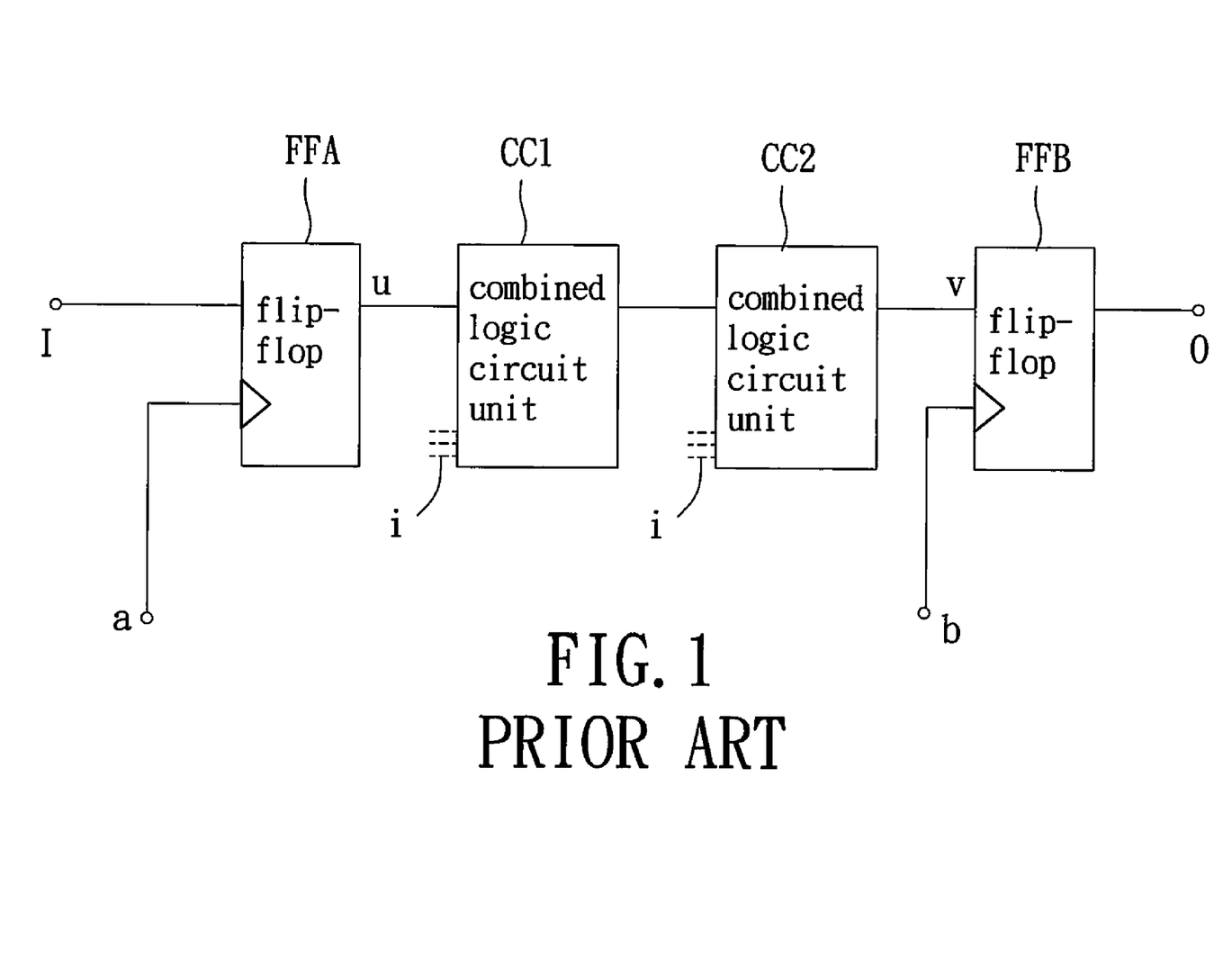
FIG. 1 shows a block diagram of a conventional sequential circuit.

Hold time fixing is required in a sequential circuit especially when the clock tree is unbalanced. FIG. 1 shows a conventional sequential circuit including two flip-flops FFA and FFB and two combinational logic circuit units CC1 and CC2. The flip-flop FFA includes a data output port u, and the flip-flop FFB includes a data input port v. The combinational logic circuit units CC1 and CC2 are well-known circuits in the art and can perform various circuit operational functions. Each combinational logic circuit unit CC1, CC2 has data input port i allowing input of data.

With reference to FIG. 1, when the flip-flop FFA is triggered by a clock a, data inputted via a data input port I is transferred by the flip-flop FFA to the combinational logic circuit unit CC1 for processing purposes and then to the combinational logic circuit unit CC2 for other processing purposes. Then, the data is sent to the data input port v of the flip-flop FFB, so that the data can be sent out to a data output port O when the flip-flop FFB is triggered by another clock b.

Figure 2A:
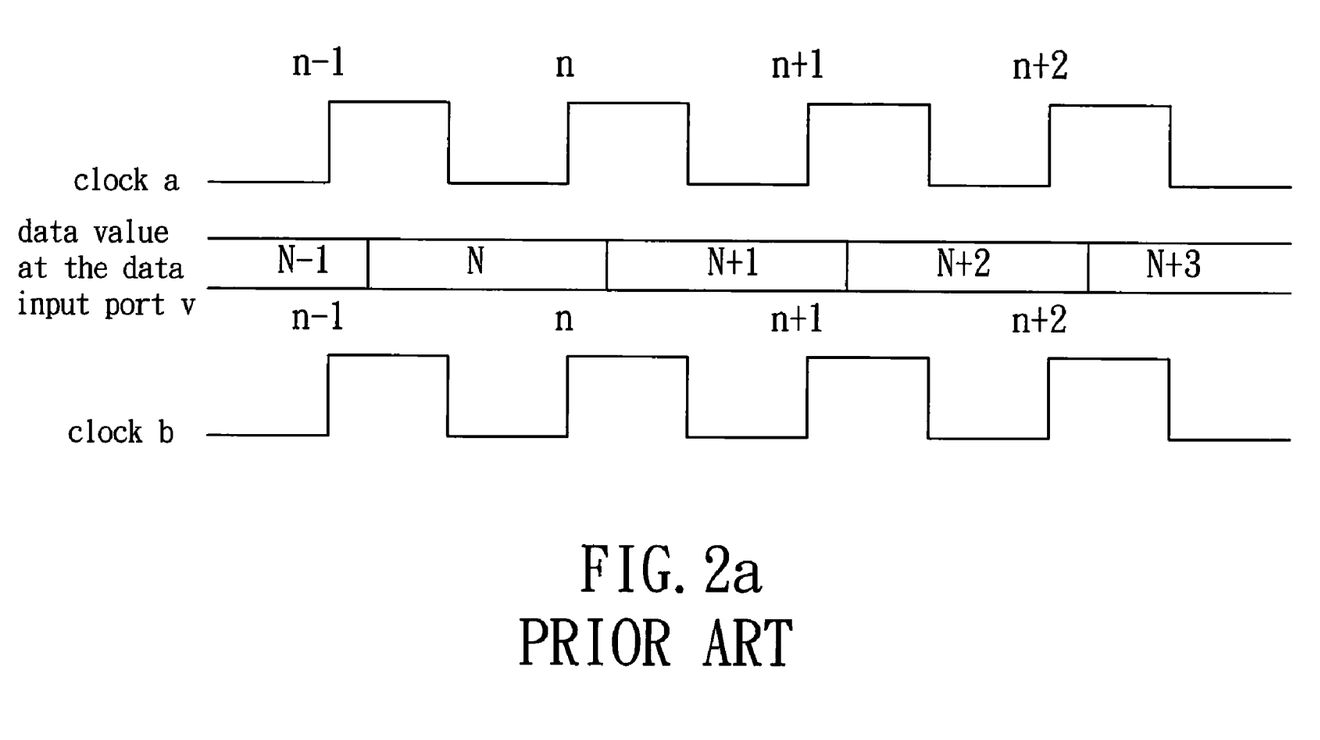
FIG. 2a shows a timing diagram of the sequential circuit of FIG. 1 in an ideal state.

FIG. 2a is a timing diagram of the sequential circuit of FIG. 1 in an ideal state, showing the ideal data value of the data input port v between the n−1th trigger and n+2th trigger of the clocks a and b. When the clock b proceeds with the n−1th trigger, the flip-flop FFB acquires the N−1th data value at the data input port v. When the clock b proceeds with the nth trigger, the flip-flop FFB acquires the Nth data value at the data input port v. Likewise, the flip-flop FFB acquires the N+1th and N+2th data values at the data input port v when the clock b proceeds with the n+1th and n+2th triggers.

Figure 2B:
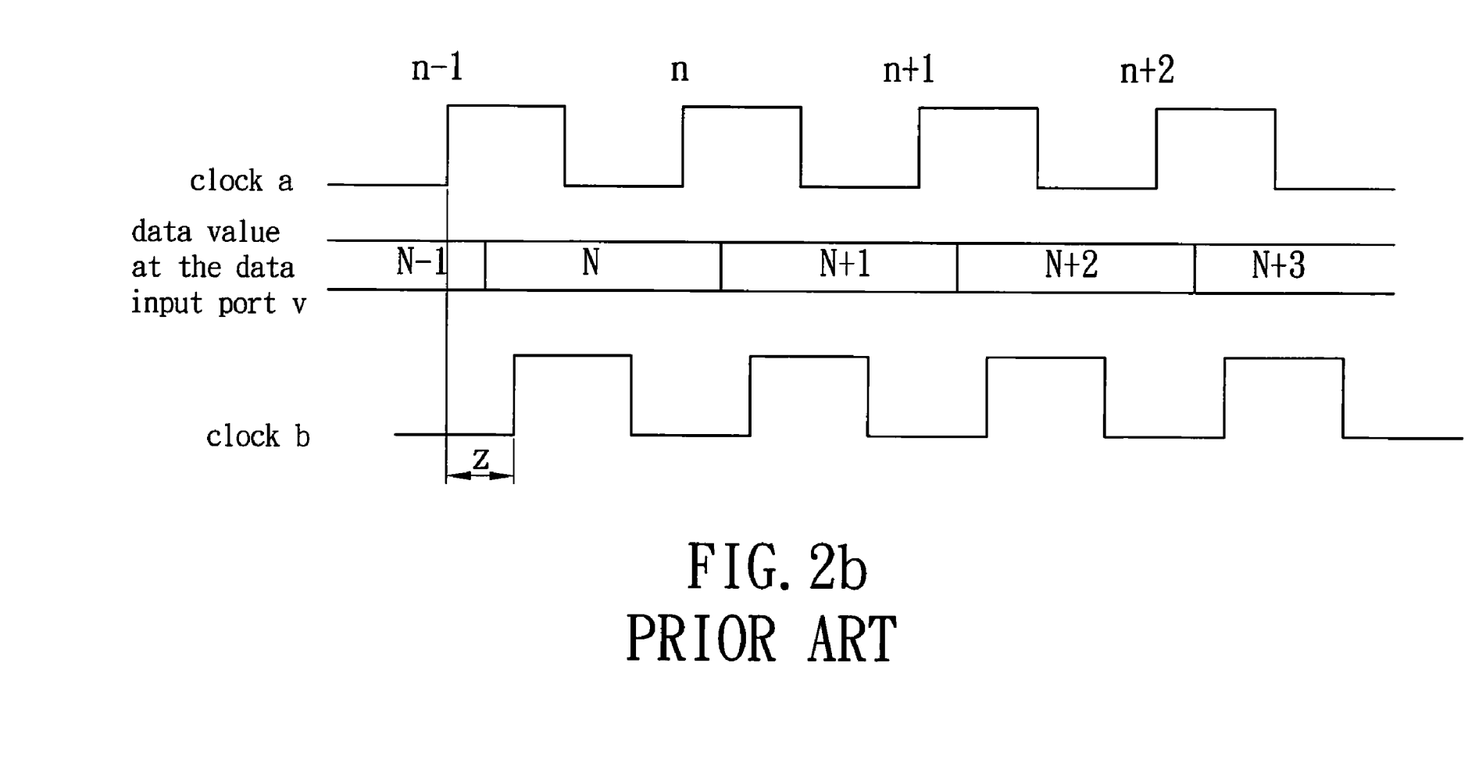
FIG. 2b shows a timing diagram of the sequential circuit of FIG. 1 resulting from an unbalanced clock tree.

FIG. 2b is a timing diagram of the sequential circuit resulting from an unbalanced clock tree. Specifically, the flip-flop FFB acquires erroneous data values between the n−1th trigger and n+2th trigger of the clocks a and b due to an unbalanced clock tree between the clocks a and b.

With reference to FIG. 2b and also to FIG. 2a, the clock b has a lag z behind the clock a; namely, the clock tree is unbalanced. When the clock b proceeds with the n−1th trigger, the flip-flop FFB will erroneously acquire the Nth data values at the data input port v. When the clock b proceeds with the nth trigger, the flip-flop FFB will erroneously acquire the N+1th data value at the data input port v. Likewise, the flip-flop FFB will acquire the N+2th and N+3th data values at the data input port v when the clock b proceeds with the n+1th and n+2th triggers.

In an attempt to solve the above problems, the delay time between the data output port u and the data input port v has to be increased, so that the flip-flop FFB can acquire the correct data value at the data input port v when the clock b proceeds with trigger. Namely, when unbalanced clock tree occurs in sequential circuits, the delay time need to be additionally increased to fix the problems.

Figure 3:
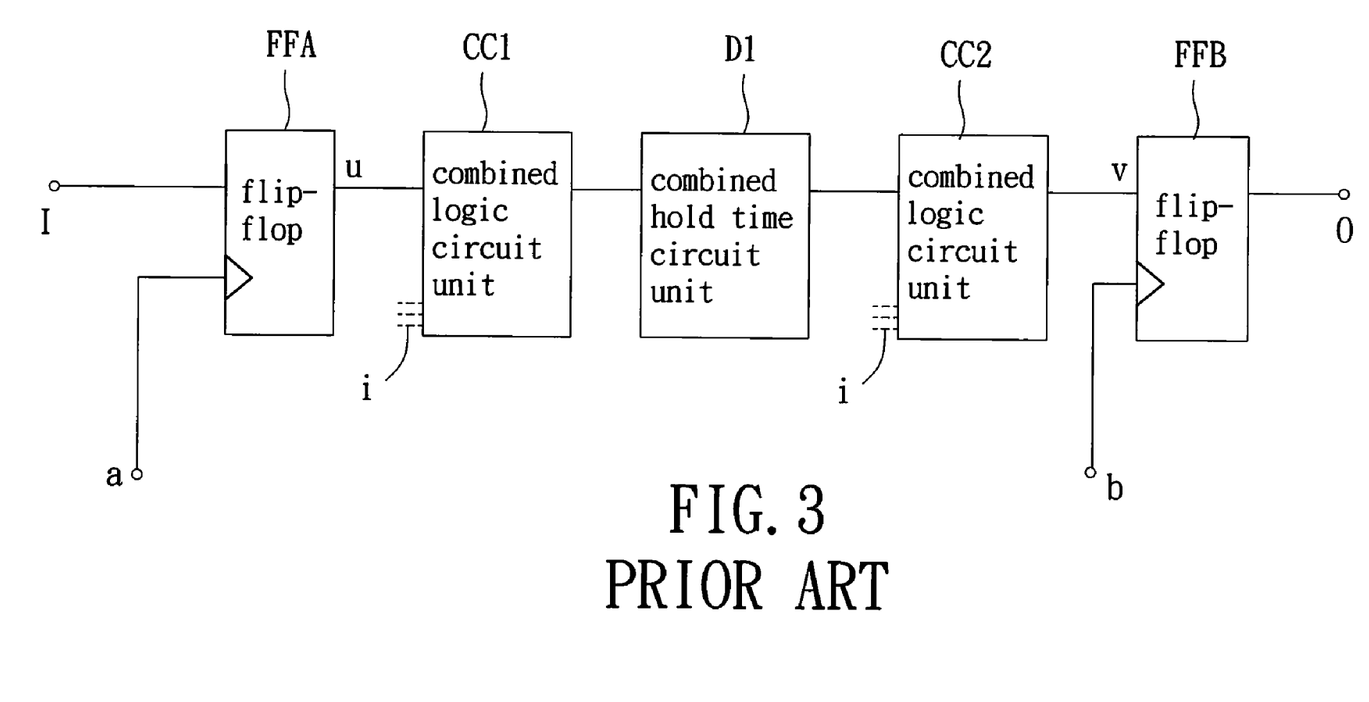
FIG. 3 shows a conventional sequential circuit with hold time fixing function.

Conventionally, a passive delay circuit is added based on the required hold time in a combinational hold time circuit approach for solving the hold time problem in sequential circuits. FIG. 3 shows a conventional sequential circuit with hold time fixing function by adding a combinational hold time circuit unit D1 between the combinational logic circuit units CC1 and CC2. The combinational hold time circuit unit D1 is a well-known circuit in the art for estimating the lag z by timing analysis. At least one delay cell is added into the sequential circuit of FIG. 1 based on the operational result of the operational circuit, so that the data inputted to the sequential circuit during the lag z is held and not outputted via the data output port O until the clocks a and b are both at "on" level.

However, the more need in hold time, the more delay cells are required in the circuits. As a result, the area occupied by the combinational hold time circuit becomes larger. The manufacturing costs of the hold time circuit are increased. Furthermore, the connection arrangement between the delay cells and the sequential circuit is more difficult.

Thus, a need exists for an improved hold time fixing circuit unit for solving the above problems.

SUMMARY OF THE INVENTION

The primary objective of the present invention is to provide an automatic hold time fixing circuit unit utilizing a simple circuitry to compensate the lag between two clocks by automatic adjustment of hold time, avoiding output of erroneous data resulting from the lag.

Another objective of the present invention is to provide an automatic hold time fixing circuit unit utilizing a combination of two switches, a memory element, and a control circuit to automatically adjust the hold time based on the length of lag, fixing the erroneous data output resulting from an unbalanced clock tree of two clocks.

In a first aspect according to the preferred teachings of the present invention, an automatic hold time fixing circuit unit includes a first switch having first and second ends electrically connected to a data input port and a data output port, respectively. The first switch further includes a control end controlling connection or disconnection of the first and second ends of the first switch. A memory element includes an input end and an output end. The input end of the memory element is electrically connected to the second end of the first switch. A second switch includes a first end electrically connected to the output end of the memory element and a second end electrically connected to the data output port. The second switch further includes a control end controlling connection or disconnection of the first and second ends of the second switch. A control circuit includes a first output terminal, a second output terminal, a first input terminal, and a second input terminal. The first and second output terminals are electrically connected to the control ends of the first and second switches, respectively. The first and second input terminals allow input of two clocks to the control circuit for controlling connection or disconnection of the first and second switches. By such an arrangement, the data stored in the memory element can effectively compensate the data not transferred to the data output end during a phase lag of the two clocks.

In a preferred form, the control circuit includes an AND gate and first and second inverters. The AND gate includes a first input port forming the first input terminal. The AND gate further includes a second input port electrically connected to an output end of the first inverter. The AND gate further includes an output port forming the second output terminal. The first inverter includes an input end forming the second input terminal. The second inverter includes an input end electrically connected to the output port of the AND gate. The second inverter further includes an output end forming the first output terminal.

The automatic hold time fixing circuit unit can be utilized to control a hold time of a digital logic circuit.

The control circuit can be formed by using the above circuits that are simple in circuitry. Thus, the automatic hold time fixing circuit unit according to the preferred teachings of the present invention can reduce the costs of designing and manufacturing.

The present invention will become clearer in light of the following detailed description of illustrative embodiments of this invention described in connection with the drawings.

BRIEF DESCRIPTION OF THE DRAWINGS

The illustrative embodiments may best be described by reference to the accompanying drawings where.

DETAILED DESCRIPTION OF THE INVENTION

Figure 4:
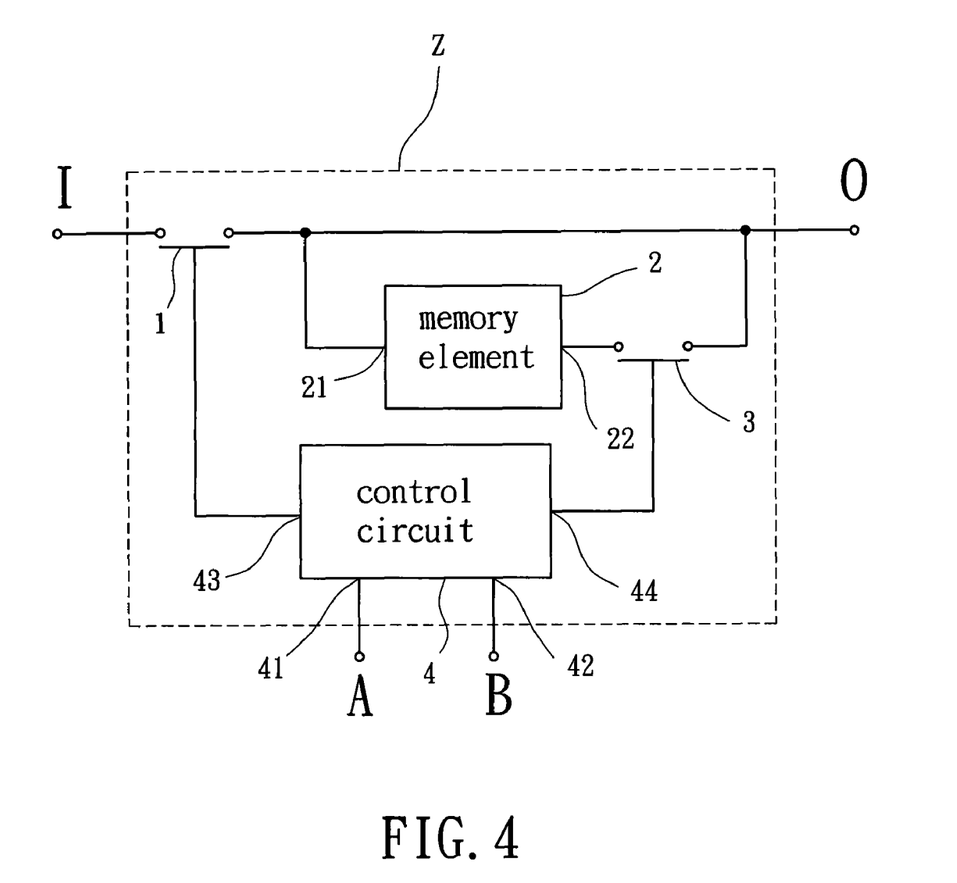
FIG. 4 shows a circuitry of an automatic hold time fixing circuit unit according to the preferred teachings of the present invention.

FIG. 4 shows an automatic hold time fixing circuit unit Z according to the preferred teachings of the present invention. Specifically, the automatic hold time fixing circuit unit Z includes a data input port I, a data output port O, a first clock input end A, a second clock input end B, a first switch 1, a memory element 2, a second switch 3, and a control circuit 4. The data input port I allows input of data to the automatic hold time fixing circuit unit Z, and the data output port O allows output of data from the automatic hold time fixing circuit unit Z. Each of the first and second clock input ends A and B allows input of a clock, so that the automatic hold time fixing circuit unit Z can decide whether the data inputted via the data input port I should be transferred to the data output port O.

First and second ends of the first switch 1 are respectively connected to the data input port I and the data output port O. The first switch 1 further includes a control end for controlling connection or disconnection between the data input port I and the data output port O. The memory element includes an input end 21 and an output end 22. The input end 21 is electrically connected to the second end of the first switch 1 electrically connected to the data output port O. The output end 22 is electrically connected to an end of the second switch 3. The other end of the second switch 3 is electrically connected to the data output port O. The second switch 3 further includes a control end for controlling connection or disconnection between the output end 22 and the data output port O.

The control circuit 4 includes a first input terminal 41, a second input terminal 42, a first output terminal 43, and a second output terminal 44. The first and second input terminals 41 and 42 are electrically connected to the first clock input end A and the second clock input end B, respectively. The first and second output terminals 43 and 44 are electrically connected to the control end of the first switch 1 and the control end of the second switch 3, respectively. Thus, two clocks inputted to the control circuit 4 via the first and second input terminals 41 and 42 control on and off of the first and second switches 1 and 3.

With reference to FIG. 4, when the first and second clock input ends A and B are balanced (i.e., the first clock input end A is ON while the second clock input end B is ON), the first switch 1 is on and the second switch 3 is off under control of the control circuit 4. Thus, data inputted to the automatic hold time fixing circuit unit Z via the data input port I is sent to the data output port O. At the same time, the data is sent via the input end 21 to the memory element 2 for storage purposes.

On the other hand, in a case that the clock tree is unbalanced and that the clock of the second clock input end B has a lag behind the clock of the first clock input end A (i.e., the clock of the second clock input end B is OFF when the clock of the first clock input end A is ON), the first switch 1 becomes off and the second switch 3 becomes on under control of the control circuit 4. In this case, the data inputted to the automatic hold time fixing circuit unit Z can not pass through the first switch 1. Meanwhile, the data previously stored while the clock tree is balanced is sent by the memory element 2 to the data output port O via the output end 22 and the second switch 3. By doing so, when the clock of the second input end B has a lag z behind the clock of the first clock input end A (namely, the clock of the second clock input end B is OFF when the clock of the first clock input end A is ON during the lag z), the data stored in the memory element 2 "compensates" the data not transferred to the data output port O during the lag z.

Figure 5A:
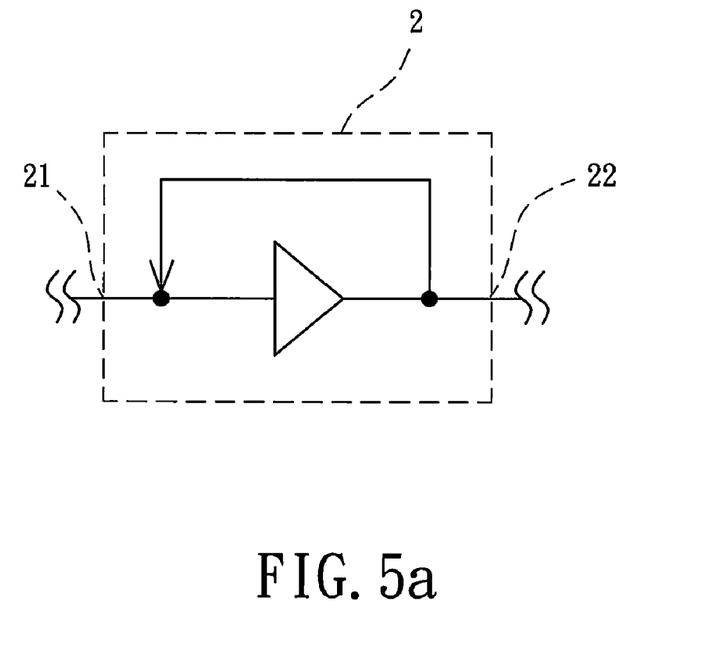
FIG. 5a shows an example of a memory element of the automatic hold time fixing circuit unit of FIG. 4.
Figure 5B:
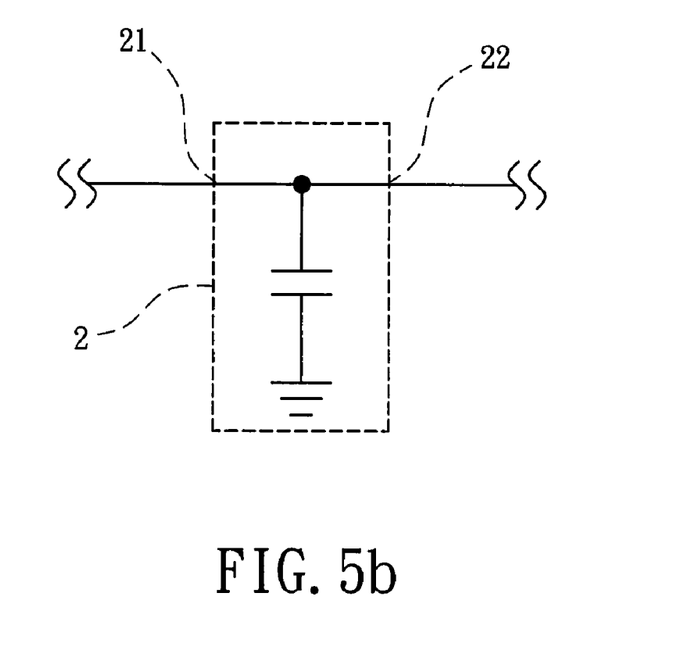
FIG. 5b shows another example of the memory element of the automatic hold time fixing circuit unit of FIG. 4.

FIGS. 5a and 5b show two examples of the memory element 2 of the automatic hold time fixing circuit unit Z. Specifically, the memory element 2 can be in the form of a feedback buffer in FIG. 5a or in the form of a capacitor in FIG. 5b. One end of the capacitor is electrically connected to the input end 21 and the output end 22. The other end of the capacitor is electrically connected to a grounding point. The data can be inputted via the input end 21 to the memory element 2 by charging or discharging the capacitor.

Figure 6:
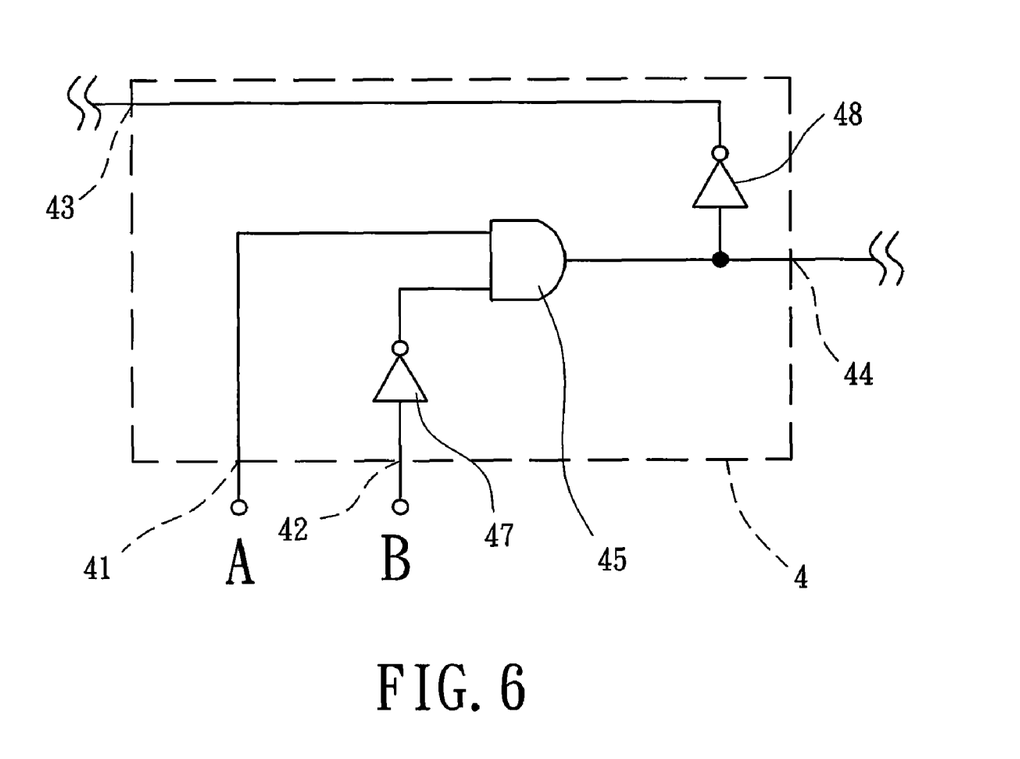
FIG. 6 shows an example of a control circuit of the automatic hold time fixing circuit unit of FIG. 4.

FIG. 6 shows an example of the control circuit 4 of the automatic hold time fixing circuit unit Z. Specifically, the control circuit 4 includes an AND gate 45, a first inverter 47, and a second inverter 48. The AND gate 45 includes two input ports and an output port. Each of the first and second inverters 47 and 48 has an input end and an output end. More specifically, one of the input ports of the AND gate 45 forms the first input terminal 41. The other input port of the AND gate 45 is electrically connected to the output end of the first inverter 47. The output port of the AND gate 45 forms the second output terminal 44. The input end of the first inverter 47 forms the second input terminal 42. The input end of the second inverter 48 is electrically connected to the output port of the AND gate 45. By this arrangement, the control circuit 4 can include only one AND gate 45 and two inverters 47 and 48, which is simple in circuitry.

With reference to FIGS. 4 and 6, when the clock tree is balanced, (i.e., the first clock input end A is ON while the second clock input end B is ON), the first output terminal 43 of the control circuit 4 outputs an ON signal to turn on the switch 1. Furthermore, the second output terminal 44 outputs an OFF signal to turn off the second switch 3. Thus, data inputted to the automatic hold time fixing circuit unit Z via the data input port I is sent through the first switch 1 to the data output port O. At the same time, the data is transferred via the input end 21 to the memory element 2 for storage purposes.

On the other hand, in a case that the clock tree is unbalanced and that the clock of the second clock input end B has a lag z behind the clock of the first clock input end A (i.e., the clock of the second clock input B is OFF when the clock of the first clock input A is ON), the first output terminal 43 of the control circuit 4 outputs an OFF signal to turn off the first switch 1. At the same time, the second output terminal 44 outputs an ON signal to turn on the second switch 3. In this case, the data inputted to the automatic hold time fixing circuit unit Z via the data input port I can not pass through the first switch 1. Meanwhile, the data previously stored while the clock tree is balanced is sent via the output end 22 and the second switch 3 to the data output port O. By such an arrangement, the data stored in the memory element 2 "compensates" the data not transferred to the data output port O during the lag z.

Figure 7:
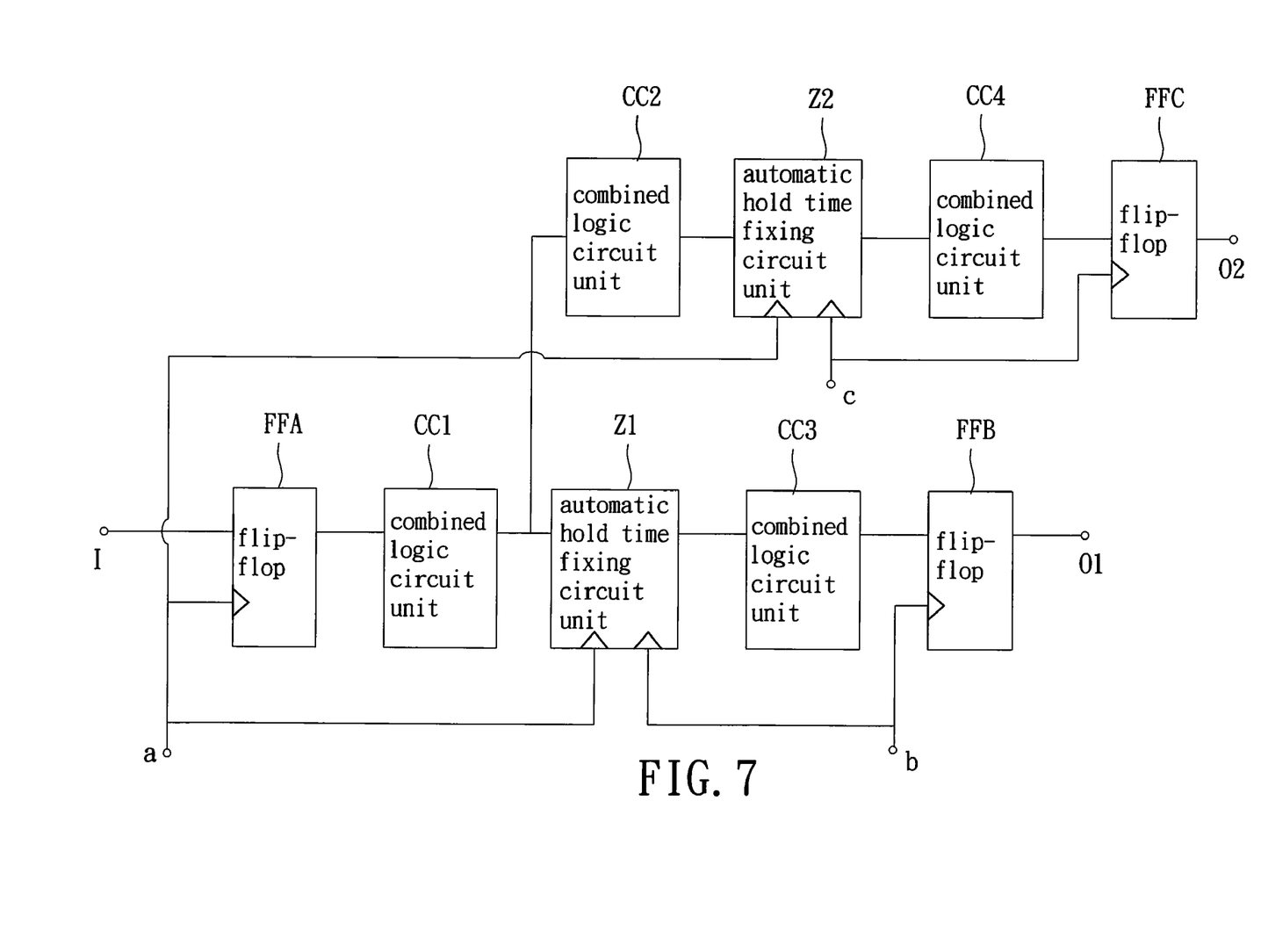
FIG. 7 shows an application of the automatic hold time fixing circuit unit of FIG. 4.

FIG. 7 shows an application of the automatic hold time fixing circuit unit Z. The application includes three flip-flops FFA, FFB, and FFC, four combinational logic circuit units CC1, CC2, CC3, and CC4, and two automatic hold time fixing circuit units Z1 and Z2 according to the preferred teachings of the present invention. The combinational logic circuit units CC1, CC2, CC3, and CC4 are well-known circuits in the art and can perform various circuit operational functions.

As an example, when the flip-flop FFA is triggered by the clock a, the data at the data input port I is transferred by the flip-flop FFA to the combinational logic circuit unit CC1 for processing purposes and then to the automatic hold time fixing circuit unit Z1 and the combinational logic circuit unit CC2 for other processing purposes. The automatic hold time fixing circuit unit Z1 proceeds with hold time fixing to eliminate erroneous data output resulting from the lag between the clocks a and b. Namely, the combinational logic circuit unit CC3 can obtain correct data after processing of the automatic hold time fixing circuit unit Z1, and the data is then outputted to the data output port O1 via the flip-flop FFB.

Likewise, after receiving data from the combinational logic circuit unit CC2, the automatic hold time fixing circuit unit Z2 can fix the errors resulting from the lag between the clocks a and b, so that the combinational logic circuit unit CC4 can obtain correct data, and the data is then outputted to the data output port O2 via the flip-flop FFC.

The control circuit 4 of the automatic hold time fixing circuit unit Z according to the preferred teachings of the present invention controls the hold time of digital logic circuits to solve the problem of hold time violation, an example of the applications is shown in FIG. 7.

Figure 8:
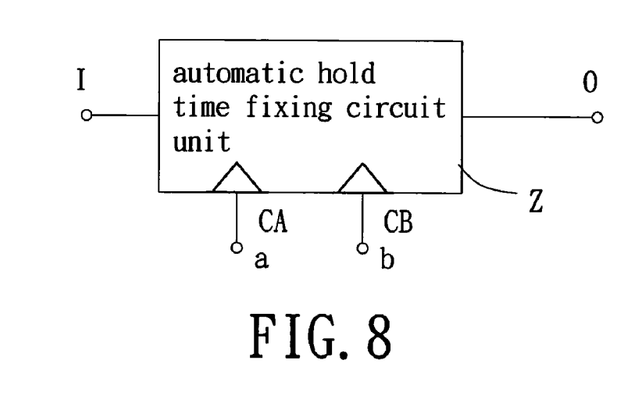
FIG. 8 shows application of the automatic hold time fixing circuit unit of FIG. 4 after packaging.

Other applications of the automatic hold time fixing circuit unit Z according to the preferred teachings of the present invention are possible. FIG. 8 shows an application of the automatic hold time fixing circuit unit Z after packaging. Specifically, the automatic hold time fixing circuit unit Z includes a data input port I allowing input of data to the automatic hold time fixing circuit unit Z. The automatic hold time fixing circuit unit Z further includes a data output port O allowing output of data from the automatic hold time fixing circuit unit Z. The automatic hold time fixing circuit unit Z further includes two clock input ends CA and CB allowing input of two clocks a and b to the automatic hold time fixing circuit unit Z. When the clocks a and b are balanced, the automatic hold time fixing circuit unit Z stores the inputted data in the memory element 2 and transmits the data to the data output port O based on the clocks a and b. On the other hand, when the clocks a and b are unbalanced, the automatic hold time fixing circuit unit Z transmits the data stored in the memory element 2 to the data output port O. By this arrangement, the automatic hold time fixing circuit unit Z according to the preferred teachings of the present invention can be utilized in various circuits to compensate the lag resulting from the phase difference of the clocks and to avoid erroneous data output.

Figure 9:
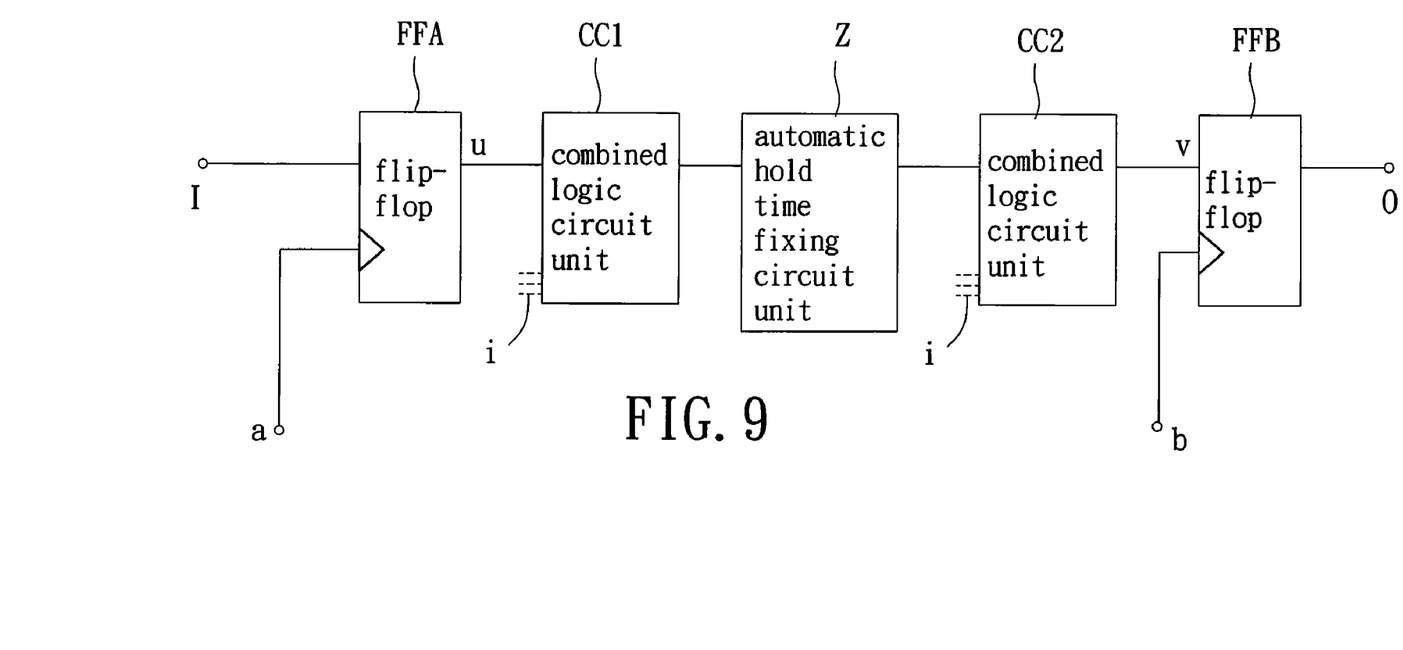
FIG. 9 shows a sequential circuit of the automatic hold time fixing circuit unit of FIG. 4.

FIG. 9 shows a sequential circuit of the automatic hold time fixing circuit unit Z according to the preferred teachings of the present invention. Specifically, the automatic hold time fixing circuit unit Z according to the preferred teachings of the present invention is connected between two combinational logic circuit units CC1 and CC2 and simultaneously receives two clocks a and b to automatically adjust the hold time to avoid erroneous data output resulting from an unbalanced clock tree.

The clock tree can be balanced or unbalanced. For ease of explanation of the operation of the automatic hold time fixing circuit unit Z according to the preferred teachings of the present invention and for ease of comparison with the conventional sequential circuit, it is assumed that the timing diagram of the sequential circuit of FIG. 9 in an ideal state is identical to that shown in FIG. 2a. Specifically, when the clock b proceeds with the n−1 th trigger, the flip-flop FFB acquires the N−1 th data value at the data input port v. When the clock b proceeds with the nth trigger, the flip-flop FFB acquires the Nth data value at the data input port v. Likewise, the flip-flop FFB acquires the N+1 th and N+2th data values at the data input port v when the clock b proceeds with the n+1th and n+2th triggers.

In the conventional sequential circuit mentioned above and illustrated in FIGS. 1, 2a and 2b, the flip-flop FFB erroneously acquires data values between the n−1th trigger and n+2th trigger of the clocks a and b due to unbalanced clock tree between the clocks a and b. Specifically, when the clock b proceeds with the n−1 th trigger, the flip-flop FFB will erroneously acquire the Nth data value at the data input port v. When the clock b proceeds with the nth trigger, the flip-flop FFB will erroneously acquire the N+1th data value at the data input port v. Likewise, the flip-flop FFB acquires the N+2th and N+3th data values at the data input port v when the clock b proceeds with the n+1th and n+2th triggers.

Figure 10:
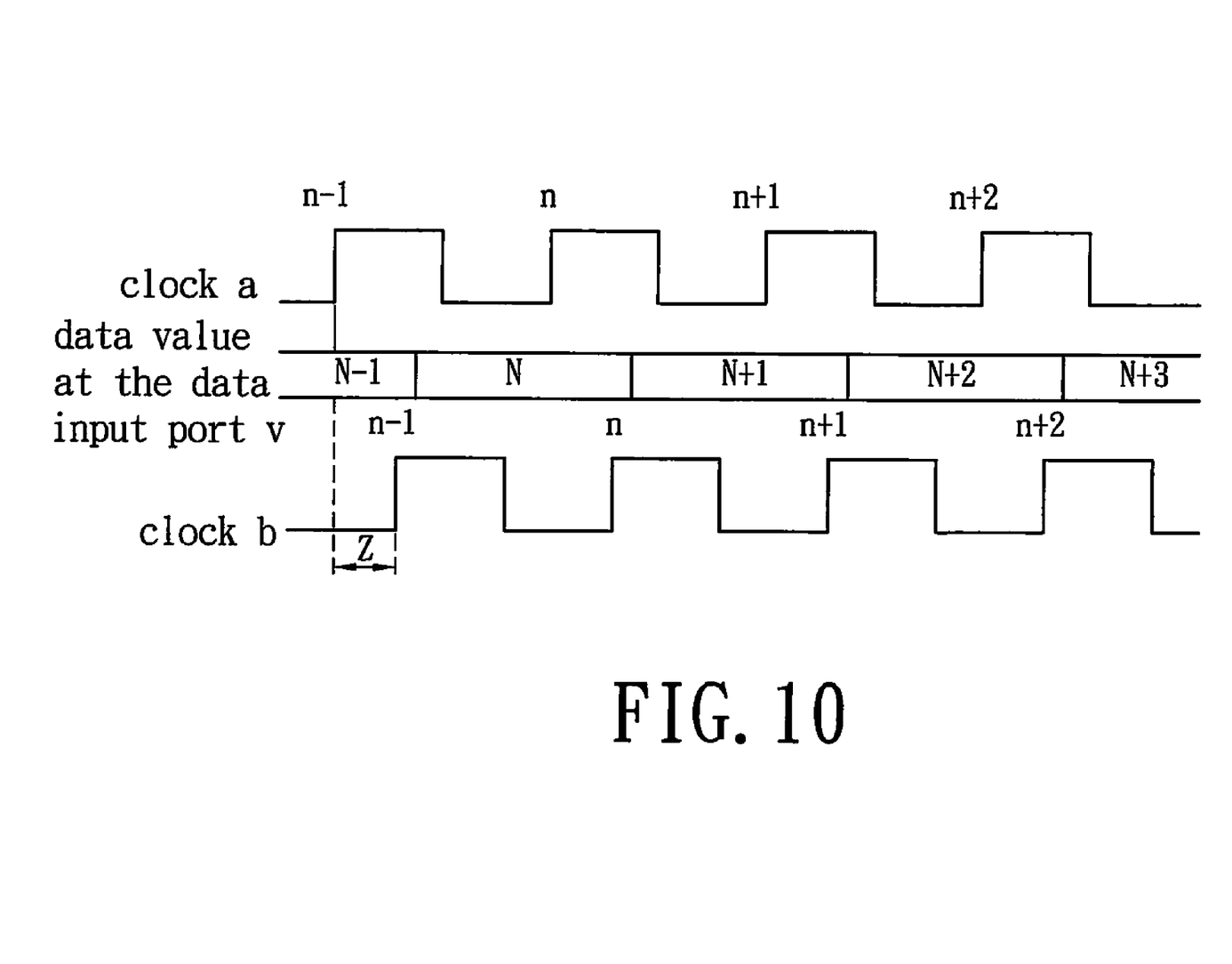
FIG. 10 shows a timing diagram of the sequential circuit of FIG. 9 resulting from an unbalanced clock tree.

FIG. 10 shows the timing diagram of the sequential circuit of FIG. 9 resulting from an unbalanced clock tree. Specifically, the clock b has a lag z behind the clock a. When the clock b proceeds with the n−1th trigger, since the automatic hold time fixing circuit unit Z according to the preferred teachings of the present invention provides the data at the data input port v with more hold time, the flip-flop FFB can acquire the correct Nth data value from the data input port v. Likewise, when the clock b proceeds with the nth trigger, the automatic hold time fixing circuit unit Z according to the preferred teachings of the present invention provides the data at the data input port v with more hold time, the flip-flop FFB can acquire the correct N+1th data value from the data input port v. Likewise, when the clock b proceeds with the n+1th and n+2th triggers, the flip-flop FFB can acquire the correct N+2 and N+3 data values at the data input port v, for the automatic hold time fixing circuit unit Z according to the preferred teachings of the present invention provides the data at the data input port v with more hold time.

Namely, the automatic hold time fixing circuit unit Z according to the preferred teachings of the present invention allows automatic adjustment of the hold time between the data input port v and the data output port u, so that the hold time between the data input port v and the data output port u is longer than the lag z. Thus, when the clock b proceeds with a trigger, the data output port O can acquire the correct data value.

Conclusively, compared to the conventional hold time circuit unit utilizing timing analysis to estimate the hold time that is difficult to implement and that results in a bulky circuit, the automatic hold time fixing circuit unit Z according to the preferred teachings of the present invention utilizes the memory element 2 and the control circuit 4 having simple circuitries to correctly send the data stored in the memory element 2 to the data output port O when the clock tree is unbalanced. Furthermore, the automatic hold time fixing circuit unit Z according to the preferred teachings of the present invention can be utilized to solve the problem of hold time violation in digital logic circuits, an example of which is shown in FIG. 7.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. An automatic hold time fixing circuit unit comprising:
   a first switch including first and second ends electrically connected to a data input port and a data output port, respectively, with the first switch further including a control end controlling connection or disconnection of the first and second ends of the first switch;
   a memory element including an input end and an output end, with the input end of the memory element electrically connected to the second end of the first switch;
   a second switch including a first end electrically connected to the output end of the memory element and a second end electrically connected to the data output port, with the second switch further including a control end controlling connection or disconnection of the first and second ends of the second switch; and
   a control circuit including a first output terminal, a second output terminal, a first input terminal, and a second input terminal, with the first and second output terminals electrically connected to the control ends of the first and second switches, respectively, with the first and second input terminals allowing input of two clocks to the control circuit for controlling connection or disconnection of the first and second switches,
   wherein the control circuit includes an AND gate and first and second inverters, with the AND gate including a first input port forming the first input terminal, with the AND gate further including a second input port electrically connected to an output end of the first inverter, with the AND gate further including an output port forming the second output terminal, with the first inverter including an input end forming the second input terminal, with the second inverter including an input end electrically connected to the output port of the AND gate, and with the second inverter further including an output end forming the first output terminal.

2. The automatic hold time fixing circuit unit as claimed in claim 1, with the memory element including a feedback buffer.

3. The automatic hold time fixing circuit unit as claimed in claim 1, with the memory element including a capacitor having a first end electrically connected to the input end and the output end of the memory element, and with the capacitor further having a second end electrically connected to a grounding point.

4. The automatic hold time fixing circuit unit as claimed in claim 1, with the automatic hold time fixing circuit unit adapted to control a hold time of a digital logic circuit.

5. An automatic hold time fixing circuit unit comprising:
   a data input port allowing input of data to the automatic hold time fixing circuit unit;
   a data output port allowing output of data from the automatic hold time fixing circuit unit; and
   first and second clock input ends allowing input of first and second clocks to the automatic hold time fixing circuit unit,
   wherein when the first and second clocks are balanced, the inputted data is stored in a memory element and transferred to the data output port, and
   wherein when the second clock has a delay behind the first clock, the data stored in the memory element is transferred to the data output port.

6. The automatic hold time fixing circuit unit as claimed in claim 5, with the control circuit including an AND gate and first and second inverters, with the AND gate including a first input port forming the first input terminal, with the AND gate further including a second input port electrically connected to an output end of the first inverter, with the AND gate further including an output port forming the second output terminal, with the first inverter including an input end forming the second input terminal, with the second inverter including an input end electrically connected to the output port of the AND gate, and with the second inverter further including an output end forming the first output terminal.

7. The automatic hold time fixing circuit unit as claimed in claim 5, with the memory element including a feedback buffer.

8. The automatic hold time fixing circuit unit as claimed in claim 5, with the memory element including a capacitor having a first end electrically connected to the input end and the output end of the memory element, and with the capacitor further having a second end electrically connected to a grounding point.

9. The automatic hold time fixing circuit unit as claimed in claim 5, with the automatic hold time fixing circuit unit adapted to control a hold time of a digital logic circuit.

10. An automatic hold time fixing circuit unit comprising:
    a first switch including first and second ends electrically connected to a data input port and a data output port, respectively, with the first switch further including a control end controlling connection or disconnection of the first and second ends of the first switch;
    a memory element including an input end and an output end, with the input end of the memory element electrically connected to the second end of the first switch;
    a second switch including a first end electrically connected to the output end of the memory element and a second end electrically connected to the data output port, with the second switch further including a control end controlling connection or disconnection of the first and second ends of the second switch; and
    a control circuit including a first output terminal, a second output terminal, a first input terminal, and a second input terminal, with the first and second output terminals electrically connected to the control ends of the first and second switches, respectively, with the first and second input terminals allowing input of first and second clocks to the control circuit, wherein when the first and second clocks are balanced, the inputted data is stored in a memory element and transferred to the data output port, and wherein when the second clock has a delay behind the first clock, the data stored in the memory element is transferred to the data output port.

11. The automatic hold time fixing circuit unit as claimed in claim 10, with the control circuit including an AND gate and first and second inverters, with the AND gate including a first input port forming the first input terminal, with the AND gate further including a second input port electrically connected to an output end of the first inverter, with the AND gate further including an output port forming the second output terminal, with the first inverter including an input end forming the second input terminal, with the second inverter including an input end electrically connected to the output port of the AND gate, and with the second inverter further including an output end forming the first output terminal.

12. The automatic hold time fixing circuit unit as claimed in claim 10, with the memory element including a feedback buffer.

13. The automatic hold time fixing circuit unit as claimed in claim 10, with the memory element including a capacitor having a first end electrically connected to the input end and the output end of the memory element, and with the capacitor further having a second end electrically connected to a grounding point.

14. The automatic hold time fixing circuit unit as claimed in claim 10, with the automatic hold time fixing circuit unit adapted to control a hold time of a digital logic circuit.

* * * * *